United States Patent
Liu

(10) Patent No.: US 6,514,831 B1
(45) Date of Patent: Feb. 4, 2003

(54) NITRIDE READ ONLY MEMORY CELL

(75) Inventor: Chen-Chin Liu, Yunlin Hsien (TW)

(73) Assignee: Macronix International Co., Ltd. (TW)

(*) Notice: Subject to any disclaimer, the term of this patent is extended or adjusted under 35 U.S.C. 154(b) by 0 days.

(21) Appl. No.: 09/987,318

(22) Filed: Nov. 14, 2001

(51) Int. Cl.⁷ .............................................. H01L 21/336
(52) U.S. Cl. ...................... 438/303; 438/216; 438/238; 438/258
(58) Field of Search ............................... 438/303, 216, 438/258, 238

(56) References Cited

U.S. PATENT DOCUMENTS

| | | | |
|---|---|---|---|
| 5,966,603 A | * 10/1999 | Eitan | 438/258 |
| 6,218,227 B1 | * 4/2001 | Park et al. | 438/216 |
| 6,297,096 B1 | * 10/2001 | Boaz | 438/261 |
| 6,319,775 B1 | * 11/2001 | Halliyal et al. | 438/261 |

* cited by examiner

*Primary Examiner*—Vu A. Le
*Assistant Examiner*—Pho M. Luu

(57) ABSTRACT

A nitride read only memory (NROM) cell. In the NROM cell, a composite gate dielectric is formed on a substrate, a conformal oxide layer is formed on the surface of the composite gate dielectric, two bit line oxides in the substrate are located on two sides of the composite gate dielectric, two source/drains are respectively located under the two bit line oxides, and a gate is formed over the composite gate dielectric and the two bit line oxides. The composite gate dielectric further has a bottom oxide layer, a nitride layer and a top oxide layer, and the conformal oxide layer is deposited by chemical vapor deposition.

9 Claims, 3 Drawing Sheets

NITRIDE READ ONLY MEMORY CELL

BACKGROUND OF THE INVENTION

1. Field of Invention

The present invention relates to a semiconductor device. More particularly, the present invention relates to a nitride read only memory (NROM) device.

2. Description of Related Art

Due to the rapid developments of the semiconductor techniques and widespread application of information products, semiconductor devices now play an important role, specifically, in the flash memory. This memory has excellent program/erase characteristics and has been a master trend in the nonvolatile memory field. However, considering transistor integrity, power consumption, threshold voltage level and noise reduction, the flash memory cannot be exactly programmed or erased in the period of data access.

A typical structure of a NROM cell includes a stack composed of a bottom oxide layer, a nitride layer, a top oxide layer and conductive layer on a substrate. Two source/drains in the substrate are located on two sides of the stack to serve as bit lines. In the NROM cell, the nitride layer serves as a floating gate in the traditional flash memory to store charges, and the conductive layer serves as a control gate, which is used as a word line, on the traditional flash memory.

In U.S. Pat. No. 5,966,603, the surfaces of the source/drains are thermally oxidized to form bit line oxides, and the exposed surface of the nitride layer are thermally oxidized, too. Therefore, the charge retention time can be increased and the bit line capacitance can be decreased. But during the thermal oxidation period, the source/drains suffer seriously lateral diffusion, which limits the extent of device reduction.

SUMMARY OF THE INVENTION

It is therefore an objective of the present invention to provide a NROM cell to increase the charge retention time.

It is another an objective of the present invention to provide a method of fabricating a NROM cell to decrease the thermal budget.

It is still another an objective of the present invention to provide a method of fabricating a NROM cell to limit the lateral diffusion of source/drains.

In accordance with the foregoing and other objectives, the present invention provides a nitride read only memory (NROM) cell. The NROM cell comprises a composite gate dielectric on a substrate, a conformal oxide layer on the surface of the composite gate dielectric, two bit line oxides in the substrate located on two sides of the composite gate dielectric, two source/drains respectively located under the two bit line oxides, and a gate over the composite gate dielectric and the two bit line oxides. The composite gate dielectric comprises a bottom oxide layer, a nitride layer and a top oxide layer, and the conformal oxide layer is deposited by chemical vapor deposition.

This invention also provides a method of fabricating a NROM cell. A bottom oxide layer, a nitride layer and a top oxide layer are sequentially formed on a substrate. The top oxide layer, the nitride layer and the bottom oxide layer are then patterned to form a composite gate dielectric. Ions are implanted into the substrate by using the composite gate dielectric as a mask to form source/drains in the substrate on the two sides of the composite gate dielectric. A conformal oxide layer is deposited on surfaces of the composite gate dielectric and the source/drains by chemical vapor deposition. Surfaces of the substrate uncovered by the composite gate dielectric are thermally oxidized to form bit line oxides. A conductive layer is formed on the substrate and then patterned to form a gate over the composite gate dielectric and the bit line oxides.

In the foregoing, the conformal oxide layer is preferably a high-temperature-oxide layer formed by low-pressure vapor deposition.

In conclusion, the invention utilizes chemical vapor deposition to deposit the conformal oxide layer, which covers the exposed surface of the composite gate dielectric. Therefore, the surface of the nitride layer in the composite gate dielectric does not directly contact the gate, which would cause current leakage. Consequently, the retention time of charges stored in the nitride layer can be increased, and the thermal budget of the fabricating process and the lateral diffusion of the source/drains can be decreased.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
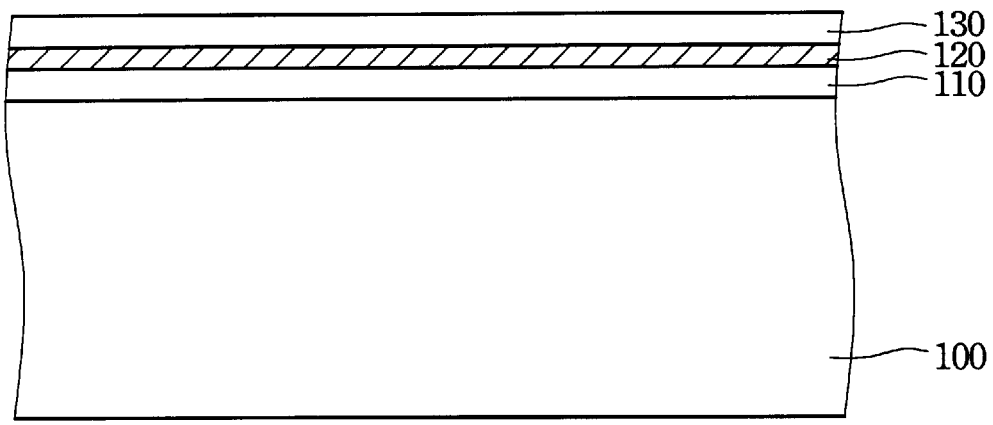
FIGS. 1A–1E are schematic, cross-sectional views showing a process of forming a NRoM cell according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A–1E are schematic, cross-sectional views showing a process of forming a NROM cell according to one preferred embodiment of this invention.

In FIG. 1A, a bottom oxide layer 110, a nitride layer 120 and a top oxide layer 130 are sequentially formed on a substrate 100 The bottom oxide layer 110 is preferably formed by thermal oxidation. The nitride layer 120 is preferably formed by chemical vapor deposition. The top oxide layer 130 is preferably formed by thermally oxidizing the nitride layer 120. Therefore, the initial thickness of the nitride layer 120 is larger than necessary to compensate for consumption of thereof during the formation of the top oxide layer 130. As an example, a preferred thickness is about 50–90 Å for the bottom oxide layer 110 and about 44–70 Å for the nitride layer 120 after forming the top oxide layer 130.

Figure 1B:
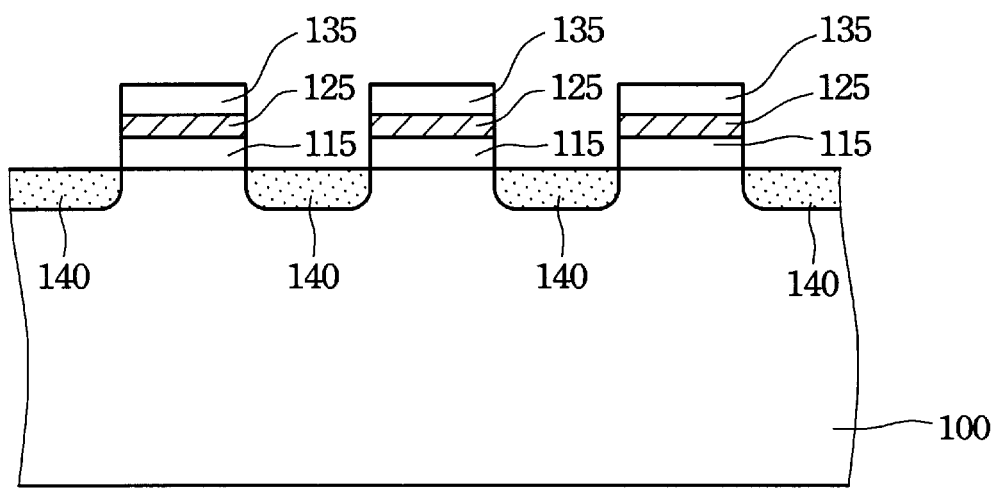

In the FIG. 1B, the top oxide layer 130, the nitride layer 120 and the bottom layer 110 are patterned by photolithography and etching to form a composite gate dielectric. The composite gate dielectric comprises a bottom oxide layer 115, a nitride layer 125 and a top oxide layer 135. Ions are implanted into the substrate 100 using the composite gate dielectric as an implanting mask to form source/drains 140 serving as bit lines.

Figure 1C:
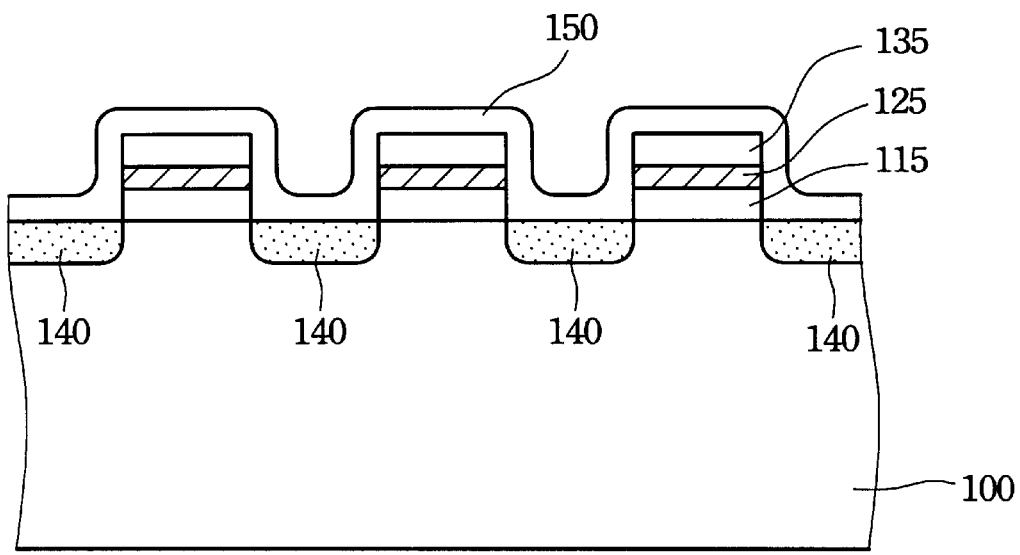

In FIG. 1C, a conformal oxide layer 150 is formed by chemical vapor deposition to cover the surface of the composite gate dielectric and the source/drains. The conformal oxide layer 150 is preferably a high-temperature-oxide layer deposited by low-pressure chemical vapor deposition (LPCVD). The gas sources can be, for example, teatra-ethoxysilicate (TEOS)/$O_2$ or $SiH_2Cl_2/N_2O$, and the LPCVD can be performed at a temperature of about 600 to about 750° C. According to the example described in FIG. 1A, the final thickness of the conformal oxide layer 150 and the top oxide layer 135 can be, for example, about 70–100 Å.

Figure 1D:
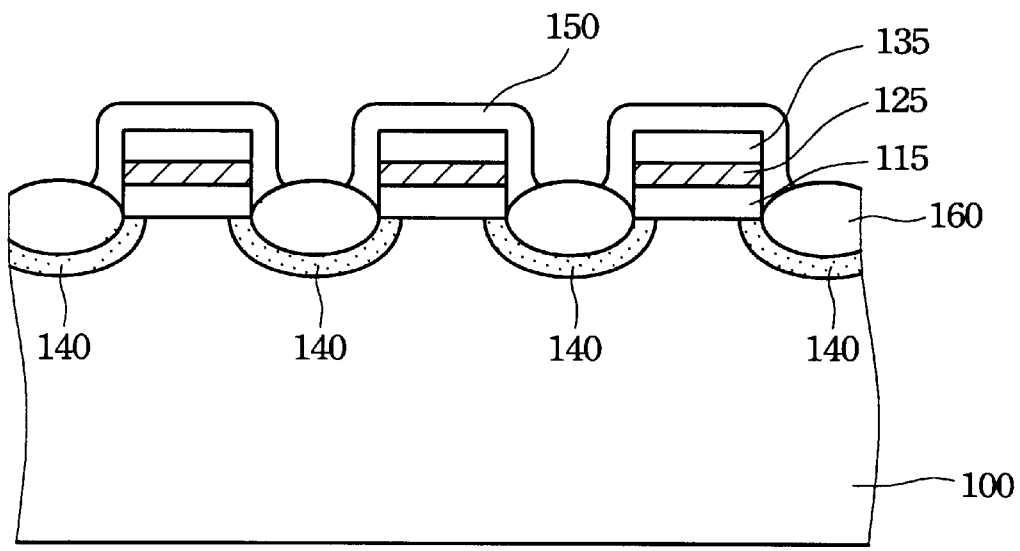

In FIG. 1D, the surfaces of the substrate 100, which are uncovered by the composite gate dielectric, are thermally oxidized to form bit line oxides 160. Since the exposed surface of the nitride layer 125 is covered by the conformal oxide layer 150, no extra time is needed to thermally oxidized the exposed surface of the nitride layer 125. Therefore, the lateral diffusion of the sources/drains can be limited.

Figure 1E:
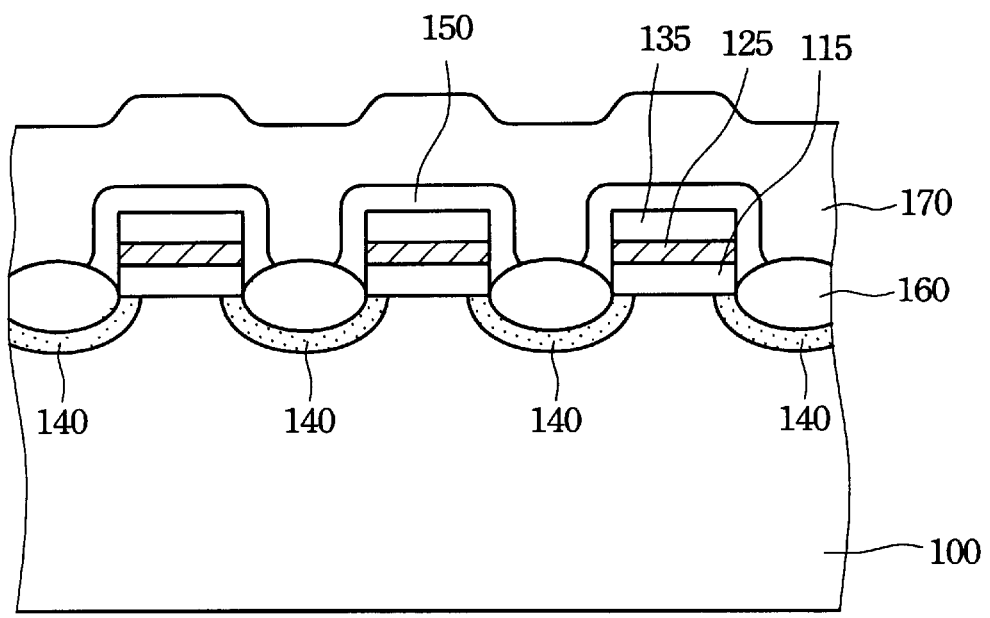

In FIG. 1E, a conductive layer is formed on the substrate and then patterned to form a gate 170 over the composite gate dielectric and the bit line oxides 160. The direction of the gate 170 is perpendicular to the direction of the source/drains 140, i.e. the bit lines. The material of the conductive layer can be, for example, polysilicon or polycide deposited by chemical vapor deposition.

In conclusion, the invention utilizes chemical vapor deposition to deposit the conformal oxide layer, which covers the exposed surface of the composite gate dielectric. Therefore, the surface of the nitride layer in the composite gate dielectric does not directly contact the gate, which would cause current leakage. Consequently, the retention time of charges stored in the nitride layer can be increased, and the thermal budget of the fabricating process and the lateral diffusion of the source/drains can be decreased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A nitride read only memory cell, comprising:

a composite gate dielectric, which comprises a bottom oxide layer, a nitride layer and a top oxide layer, on a substrate;

a conformal oxide layer on surfaces of the composite gate dielectric;

two bit line oxides in the substrate located on two sides of the composite gate dielectric;

two source/drains respectively located under the two bit line oxides; and a gate dielectric and the two bit line oxides.

2. The nitride read only memory cell of claim 1, wherein the conformal oxide layer comprises a conformal silicon oxide layer deposited by chemical vapor deposition.

3. The nitride read only memory cell of claim 1, wherein the conformal oxide layer comprises a high-temperature-oxide layer.

4. A fabrication method of nitride read only memory, comprising:

forming a bottom oxide layer on a substrate;

forming a nitride layer on the bottom oxide layer;

forming a top oxide layer on the nitride layer;

patterning the top oxide layer, the nitride layer and the bottom oxide layer to form a composite gate dielectric;

implanting ions into the substrate by using the composite gate dielectric as a mask to form source/drains in the substrate on two sides of the composite gate dielectric;

depositing a conformal oxide layer on surfaces of the composite gate dielectric and the source/drains;

thermally oxidizing surfaces of the substrate uncovered by the composite gate dielectric to form bit line oxides;

forming a conductive layer on the substrate; and patterning the conductive layer to form a gate over the composite gate dielectric and the bit line oxides.

5. The method of claim 4, wherein the conformal oxide layer is deposited by chemical vapor deposition.

6. The method of claim 5, wherein the reaction gases used by the chemical vapor deposition comprises tetraethoxysilicate and $O_2$.

7. The method of claim 5, wherein the reaction gases used by the chemical vapor deposition comprises $SiH_2Cl_2$ and $N_2O$.

8. The method of claim 4, wherein the conductive layer comprises a polysilicon layer deposited by chemical vapor deposition.

9. The method of claim 4, wherein the conductive layer comprises a polycide layer deposited by chemical vapor deposition.

* * * * *